(12) United States Patent
Letertre et al.

(10) Patent No.: US 7,256,101 B2
(45) Date of Patent: Aug. 14, 2007

(54) METHODS FOR PREPARING A SEMICONDUCTOR ASSEMBLY

(75) Inventors: Fabrice Letertre, Grenoble (FR); Bruno Ghyselen, Seyssinet-Pariset (FR); Olivier Rayssac, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 278 days.

(21) Appl. No.: 10/893,596

(22) Filed: Jul. 15, 2004

(65) Prior Publication Data

US 2005/0020031 A1 Jan. 27, 2005

Related U.S. Application Data

(63) Continuation of application No. PCT/IB03/00424, filed on Jan. 21, 2003.

(30) Foreign Application Priority Data

Jan. 22, 2002 (FR) .................................. 02 00748

(51) Int. Cl.
*H01L 21/30* (2006.01)
*H01L 21/46* (2006.01)
(52) U.S. Cl. ...................... 438/458; 438/464; 438/465; 257/E21.122
(58) Field of Classification Search ................ 438/457, 438/458, 464–465, 473, 477; 257/E21.122
See application file for complete search history.

(56) References Cited

U.S. PATENT DOCUMENTS

| | | | |
|---|---|---|---|
| 5,374,564 A | 12/1994 | Bruel | 437/24 |
| 6,171,931 B1 | 1/2001 | Murari et al. | 438/455 |
| 6,328,796 B1 | 12/2001 | Kub et al. | 117/94 |

| | | | |
|---|---|---|---|
| 2005/0042840 A1* | 2/2005 | Aga et al. | 438/458 |

FOREIGN PATENT DOCUMENTS

| | | |
|---|---|---|
| EP | 0898307 | 2/1999 |
| EP | 0924769 | 6/1999 |
| WO | WO 02/37556 | 5/2002 |
| WO | WO 02/43112 | 5/2002 |

(Continued)

OTHER PUBLICATIONS

Matsushita et al., 1990, "Fabrication of SiC Blue LEDs Using Off-Oriented Substrates", Semiconductor Research Center, pp. 343-345.

(Continued)

*Primary Examiner*—Thanhha S. Pham
(74) *Attorney, Agent, or Firm*—Winston & Strawn LLP

(57) ABSTRACT

Methods for preparing a semiconductor assembly are disclosed. In an implementation, the technique includes providing a support substrate and a bonding surface thereon, providing a donor substrate having a weakened zone that defines a useful layer and a bonding surface on the useful layer, and providing an interface layer of a predetermined material on the bonding surface of either the support substrate or the useful layer to provide a bonding surface thereon. The method also includes molecularly bonding the bonding surface of the interface layer to the bonding surface of the other of the support substrate or the useful layer to form a separable bonding interface therebetween, and to thus form the semiconductor assembly, and heat treating the semiconductor assembly to a temperature of at least 1000 to 1100° C. without substantially increasing molecular bonding between the bonding surface of the interface layer and the bonding surface of the other of the support substrate or the useful layer, so that the separable bonding interface maintains a sufficiently weak bond that can later be overcome by applying stresses to detach the useful layer from the donor substrate.

25 Claims, 3 Drawing Sheets

FOREIGN PATENT DOCUMENTS

WO       WO 02/43124       5/2002
WO       WO 02/084722       10/2002

OTHER PUBLICATIONS

Sickmiller et al., 1998, "Ultra-high Efficiency Light Emitting Diodes through Epitaxial Lift-off Packaging", International Symposium on Microelectronics, pp. 114-116.

Wong et al., 2000, "$In_x Ga_{1-x} N$ Light Emitting Diodes on Si Substrates Fabricated by Pd-In metal Bonding and Laser Lift-off", American Institute of Physics, pp. 2822-2824.

O. Rayssac et al., "From SOI to SOIM Technology: Application For Specific Semiconductor Processes", SOI Technology and Devices PX01-03 ECS Proceedings, Pennington, NJ (2001).

\* cited by examiner

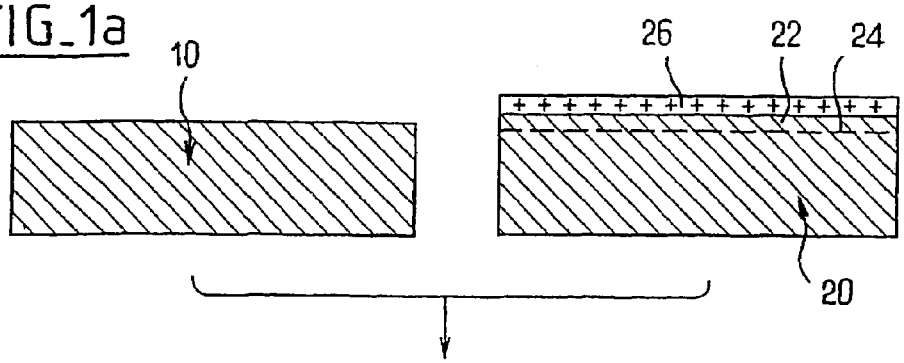
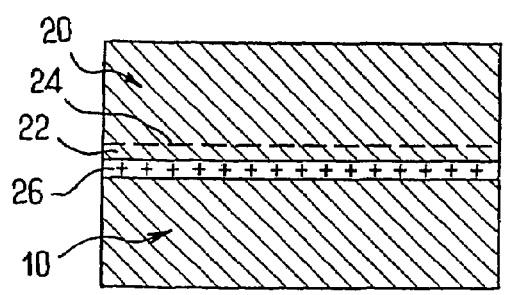
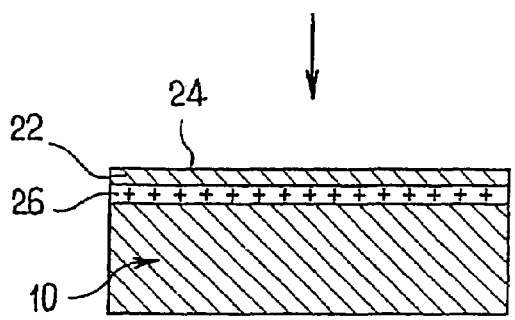
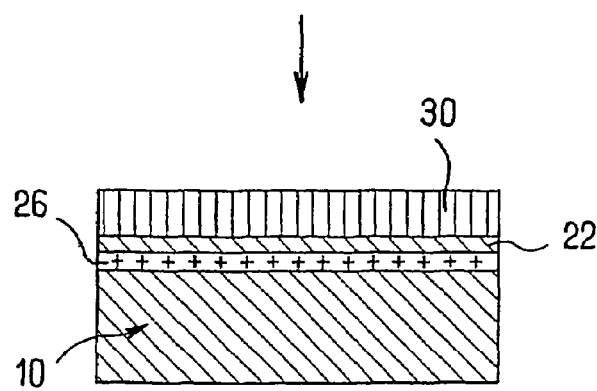

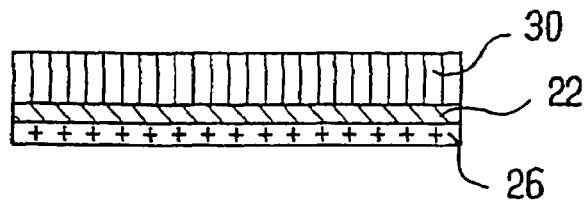
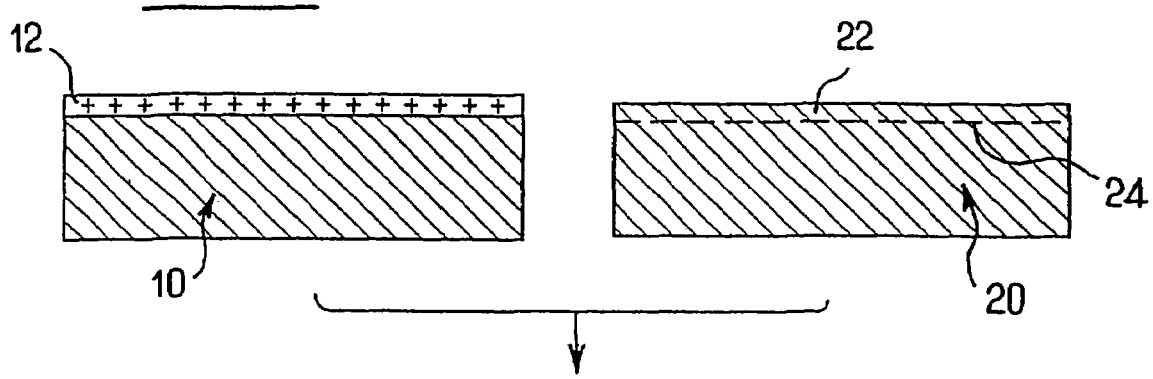
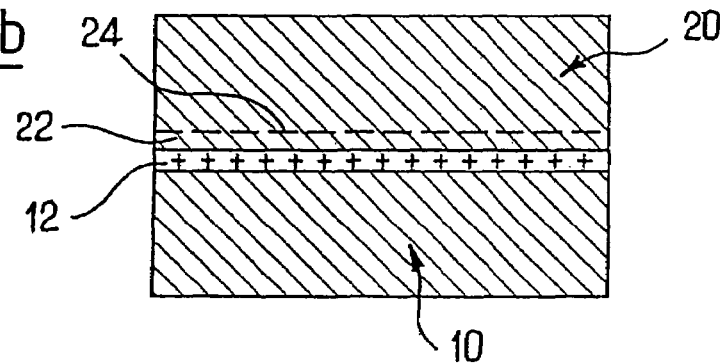
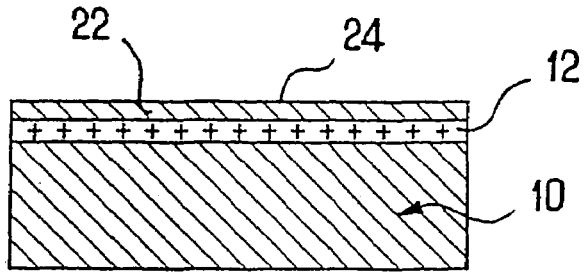

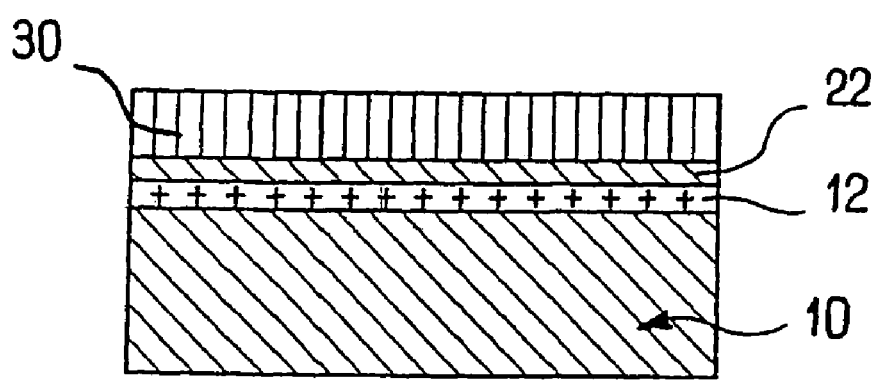
FIG_2d
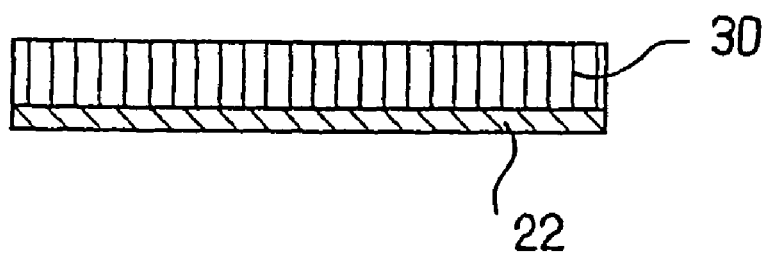
FIG_2e

METHODS FOR PREPARING A SEMICONDUCTOR ASSEMBLY

CROSS-REFERENCE TO RELATED APPLICATIONS

This application is a continuation of International application no. PCT/IB03/00424 filed Jan. 21, 2003, the entire content of which is expressly incorporated herein by reference thereto.

BACKGROUND ART

This invention generally relates to the manufacture of semiconductor substrates, particularly for use in the electronics, optoelectronics or optics industry.

Substrates composed of a film or thin layer on a thicker support are known. Electronic, optoelectronic or optical components are fabricated in the thin film or useful layer of such a substrate. During manufacturing, the thin film is separated from the support and if necessary applied onto another support. Techniques have recently been developed for separating a useful thin layer from its support.

The "epitaxial lift off" technique is well known in the domain of elements in the Group III-V classification, and consists of inserting a second thin layer between a support and a thin layer. The second thin layer is called a sacrificial layer, and this sacrificial layer is epitaxially grown. A first epitaxy operation is used to fabricate the sacrificial layer on the support, and the useful thin layer is also made by epitaxy. The sacrificial layer is made so that it can be selectively etched with respect to the support and the useful thin layer. For example, an AlAs sacrificial layer is formed between a GaAs support and a useful layer of AlGaAs. In this known technique, the sacrificial layer obtained by using a heteroepitaxy process is monocrystalline and is thin. Its nature depends on the support material upon which growth takes place.

The epitaxial lift off technique has been described in an article called: "Ultra-high efficiency light-emitting diodes through epitaxial lift-off packaging" by M. Sickmiller et al., International Symposium on Microelectronics, 1998. Its usefulness has been demonstrated for support surfaces and thin layers with an area on the order of a few square centimeters. However, further tests have cast doubt on the feasibility of this technique for significantly larger areas, for example, areas on the order of a few hundred $cm^2$ which are used in industrial substrates.

Another solution for making a separable bond consists of forming a molecular bond between a support and a thin layer, and then separating at the bonding interface at the opportune time. Bond forces obtained during this type of bonding vary depending on different parameters (such as the roughness of the surfaces, the hydrophilic properties of surfaces, the chemical affinity between materials, their tendency to creep, the temperature, and the like). In some cases, forming a separable bond in this manner could be considered. However, after using this type of bonding technique, if the thermal budget applied to the thin layer is large, then the bonding interface will be reinforced and separation will become more difficult, if not impossible.

During the manufacture of substrates for LEDs, the temperatures of some treatments (particularly epitaxy using the MOCVD technique) can reach or significantly exceed 1000 to 1100° C. In particular, when manufacturing substrates for LEDs, it may be necessary to carry out heat treatments on the support and thin film assembly using such high temperatures. For example, thermal oxidation steps or surface smoothing steps under a hydrogenated atmosphere may be required to prepare the surface before nitrides or other elements are deposited by epitaxy. These steps can occur at temperatures of more than 1150° C. If a molecular bond has been formed between two oxide layers, for example, that were added onto a support and a thin layer made of silicon carbide SiC, such temperatures would considerably increase the bonding forces causing them to reach a value of at least 2 Joules/$m^2$. Such a high bonding force makes separation impossible. It would thus be beneficial to provide a separable bonding interface, particularly for manufacturing substrates for LEDs such as blue, green or ultraviolet (UV) LEDs, which maintains separable properties even after treatment at high temperatures (in the range of about 1100° C. to about 1150° C. or more).

SUMMARY OF THE INVENTION

Presented are methods for preparing a semiconductor assembly. In an implementation, the technique includes providing a support substrate and a bonding surface thereon, providing a donor substrate having a weakened zone that defines a useful layer and a bonding surface on the useful layer, and providing an interface layer of a predetermined material on the bonding surface of either the support substrate or the useful layer to provide a bonding surface thereon. The method also includes molecularly bonding the bonding surface of the interface layer to the bonding surface of the other of the support substrate or the useful layer to form a separable bonding interface therebetween, and to thus form the semiconductor assembly, and heat treating the semiconductor assembly to a temperature of at least 1000 to 1100° C. without substantially increasing molecular bonding between the bonding surface of the interface layer and the bonding surface of the other of the support substrate or the useful layer, so that the separable bonding interface maintains a sufficiently weak bond that can later be overcome by applying stresses to detach the useful layer from the donor substrate.

In an implementation, the method also includes detaching the donor substrate from the useful layer along the weakened zone after the heat treating, and may include depositing a stack of materials on the useful layer after the detaching step. Mechanical stresses may be used to detach the useful layer from the semiconductor assembly. In an advantageous embodiment, the support substrate is made of at least one of polycrystalline silicon carbide, monocrystalline silicon carbide, or sapphire, and the interface layer may be made of at least one of silicon oxide and silicon nitride. The useful layer may be made of monocrystalline silicon carbide. In a beneficial variant, at least one of the support layer or the useful layer forms a germination layer for epitaxially growing a substrate, and the layer other than the germination layer forms a temporary support layer.

Another aspect according to the invention concerns preparing a semiconductor assembly that includes a separable interface between a support layer and a useful layer after the assembly is subjected to a high temperature of at least 1000 to 1100° C. The method includes forming the separable interface between the support layer and the useful layer by molecularly bonding two interface materials having a sufficiently low potential for chemically reacting with each other, such that heat treating the assembly at the high temperature does not increase molecular bonding so that the support layer and the useful layer can be subsequently separated at the separable interface by applying stresses to the assembly.

In an advantageous implementation, the low potential for a chemical reaction between the interface materials is a function of a weak intrinsic mutual chemical affinity of the interface materials, and or is a function of a low creep characteristic of at least one of the interface materials. The interface materials can be different. In addition, a first interface material may be made of the material of the interface layer and a second interface material may be made of the material of the useful layer. A layer that is added may be made by deposition or by chemical modification of a superficial thickness of the support, such as by oxidation and the like. In addition, the first interface material may be at least one of an oxide and a nitride, and the second interface material may be made of a carbide such as $Si_3N_4$. In a beneficial variation, the first interface material is made of the material of the interface layer and the second interface material is made of the material of the support layer. In a preferred embodiment, the first interface material is at least one of an oxide and a nitride, and the second interface material comprises a carbide. The nitride may be monocrystalline, and/or the semiconductor may be made of silicon. In an implementation, the two interface materials are semiconductor nitrides, whereas in a variant the two interface materials include a and an oxide. A preferred embodiment of the semiconductor assembly includes a silicon carbide substrate, a useful layer made of silicon carbide, and an interface layer made of a material chosen from the group including silicon oxide and silicon nitride.

In a beneficial embodiment, at least one of the interface materials has an intrinsically rough surface. Such an interface material may be formed from one of the support material or the useful layer material, or the intrinsically rough interface material could be formed by depositing an interface material on a less rough surface. In particular, the roughness of the surface of a commercial form of certain materials without any roughening treatment is significantly more than 1 Å rms and is typically about 4 Å to about 5 Å rms. Thus, the support substrate or the useful layer could be made of such a commercially available material. A typical example of such an intrinsically rough material is silicon carbide, which is commercially available with a roughness value that is rarely less than 4 Å rms. Alternately, an intrinsically rough surface can be obtained by depositing a semiconductor material on a surface that is less rough, because this type of deposition inherently results in an imperfect surface condition with a roughness value that can be as high as 4 Å to about 5 Å rms.

Another aspect of the invention concerns a method for preparing a semiconductor substrate for making optoelectronic components. The technique includes forming a separable interface between a support layer and a useful layer by molecularly bonding two interface materials having a sufficiently low potential for chemically reacting with each other according to the method described above. A stress is applied to detach the useful layer from the support layer at the separable interface, and at least one substrate layer is epitaxially grown on a surface of the useful layer. In a preferred embodiment, the epitaxially grown substrate layer is made of a metallic nitride.

Another aspect of the invention relates to a method for fabricating a semiconductor structure that includes a useful layer. This method includes providing a semiconductor assembly that includes a support substrate and a useful layer separated by an interface layer. A generally planar surface of the interface layer is molecularly bonded to a generally planar surface of the support substrate, wherein at least one of the surfaces is a monocrystalline material having a main crystallographic plane that is positioned at an inclination to the plane of its surface. The method also includes exposing the assembly to high temperatures of at least 1100 to 1150° C., and detaching the useful layer from the support substrate by applying stresses. The inclination of the main crystallographic plane intrinsically forms a sufficiently weak bond to facilitate and allow the detaching of the useful layer.

Advantageously, the inclination of the main crystallographic plane is between about 30° and about 8°, in particular in the case of commercially available silicon carbide. Typically, for such a material, a disorientation of the surface with respect to the (0001) axis of the crystal structure is preferably made along the (11-20) direction or the (1-100) direction, but other directions are also possible.

BRIEF DESCRIPTION OF THE DRAWINGS

Other aspects, purposes and advantages of the invention will become clear after reading the following detailed description with reference to the attached drawings, in which:

FIGS. 1a-1e illustrate the steps of a process according to a first embodiment of the invention; and FIGS. 2a-2e illustrate the steps in a process according to a second embodiment of the invention.

DETAILED DESCRIPTION OF THE PREFERRED EMBODIMENTS

Example embodiments of the invention are described that include an epitaxy step on a separable substrate. These examples apply to the production of blue, green or ultraviolet (UV) light emitting diodes (LEDs) and laser diodes. Thin layers are used to improve the extraction of emitted light or to improve heat dissipation due to the addition of epitaxial layers on a substrate made of a good heat conducting material, such as copper or diamond. The examples include an epitaxial stack utilizing semiconductors formed from GaN type metallic nitrides and their derivatives such as AlN, GaAlN, GaAlInN, and the like, and in general, large gap metallic nitrides.

A first example embodiment is illustrated in FIGS. 1a-1e. Referring to FIG. 1a, the first step is to prepare a solid support substrate 10, for example, made of polycrystalline silicon carbide SiC, or 4H, or 5H monocrystalline SiC, or sapphire. An assembly is also prepared that includes a donor substrate 20 made of silicon carbide SiC, preferably 4H or SR monocrystalline, with an interface layer 26 in this example made from silicon oxide $SiO_2$. An implantation step using one or several gaseous species is applied to the substrate 20 at a given average depth, and the implanting step can occur before or after forming the oxide layer 20. The implanting step creates a weakened plane or weakened zone 24 defining a thin layer or useful layer 22 adjacent to the oxide layer 26 and the rest of the substrate 20 (a SMART-CUT®-type technique, as described in U.S. Pat. No. 5,374,564 could be used).

FIG. 1b shows molecular bonding between the support 10 and the assembly 20, 22, 26 such that the silicon carbide in the support 10 is directly in contact with the oxide layer 26. It should be noted that the $SiC/SiO_2$ bonding interface (on the SiC side) made in this way has a 4 to 5 Å root mean square (rms) roughness (which is typical of commercially available SiC) that creates an intrinsically rough interface, regardless of whether the bonding is made on the Si face or the C face of a 4H or 6H type SiC material. Thus, it is not necessary to roughen the SiC surface. Furthermore, since SiC is only slightly oxidized at temperatures below 1150° C., the reactivity property of one of the bonding surfaces with respect to the other is limited (for contact with the Si face and for contact with the C face, even if the reactivity is not the same). The reactivity property in any case is much lower than the reactivity obtained for two bonding surfaces that are both made from $SiO_2$.

Reinforcing is thought to occur at an $SiO_2/SiO_2$ bonding interface at high temperatures because Si—O—Si siloxane bonds develop and also because the contacting surfaces undergo a creep effect due to expansion and contraction. In the case of an $SiC/SiO_2$ interface, the chemical stability of the SiC surface means that very few of such bonds form, or do not form at all at high temperatures. However, in this respect it should be added that different behaviors may be observed depending on whether the C or the Si face of a 4H or 6H SiC crystal is in contact with the oxide, due to the chemical reactivity between the face and $SiO_2$. Thus, it is preferable to use the Si face which is less sensitive to an oxidation reaction than the C face. Therefore, bond energies will increase slowly as a function of the added thermal energy. Furthermore, the properties of SiC are such that its surface contacting the $SiO_2$ layer does not creep (even if $SiC_2$ itself can creep). In addition, the chemical reactivity with $SiO_2$ is limited, which helps maintain the fragile nature of the bond even when the assembly in FIG. 1b is subjected to temperatures of more than 1150° C.

According to one variant, the donor substrate 20 can be cut such that the face from which the layer 22 will be sampled is slightly inclined with respect to one of the principal crystallographic planes of the structure. The angle of this inclination is preferably between 3° and 8°. In this manner, the free face of the transferred layer 22 has steps related to the successive offsets of crystals on its face, which contributes to an increase in the surface roughness which is conducive to the required separable property.

After the assembly and the support 10 have been brought into contact as illustrated in FIG. 1b, the mass of substrate 20 is removed or eliminated by applying a thermal budget and/or by using appropriate mechanical stresses. Such techniques are known, for example the SMART-CUT® and/or related techniques can be used, to detach the substrate 20 from the useful layer 22 of SiC above the oxide layer 26, as shown in FIG. 1c. Obviously, the thin useful layer 22 can be formed by any other appropriate technique.

A subsequent step consists of depositing a stack 30 of materials, such as the nitrides mentioned above, on top of this thin layer 22 to form a germ layer. For example, one or several epitaxy deposition operations could be used in a conventional manner to make LEDs. Consequently, the germination layer 22 is first prepared by polishing, annealing, smoothing annealing (for example under hydrogen), sacrificial oxidation (in which the thin layer of oxide is eliminated), etching, smoothing surface treatment, and the like. Different materials can be used to make the stack of epitaxial layers including, for example, gallium nitride GaN, aluminum nitride AlN, aluminum and gallium nitride AlGaN, gallium and indium nitride GaInN. The germination layer 22 could be composed of, for example, a monocrystalline SiC, Si(111), sapphire, monocrystalline gallium nitride GaN, neodymium and gallium oxide $NdGaO_2$, or lithium and gallium oxide $LiGaO_2$. The chosen support material 10 may be, for example, a polycrystalline or monocrystalline SiC, sapphire, or polycrystalline AlN or GaN. In terms of thickness, the support layer 10 may be, for example, a few hundred micrometers thick (typically 300 μm), while the thickness of the germination layer 22 will be on the order of 0.1 to 1 μm. The interface layer 26 is on the order of 1 μm thick.

Epitaxy techniques used to make the useful layer may include techniques well known to those skilled in the art. For example, the MBE (Molecular Beam Epitaxy) technique or the MOCVD (Metal-Organic Chemical Vapor Deposition) technique may be used. In the first case, the epitaxial growth temperatures rarely exceed 600° C., while they can be as high as 1050° C. to 1100° C. in the second case. It is important to note that even if MOCVD is used, because a molecular bonding interface was created that does not increase in strength that much at temperatures below 1100-1150° C., such an interface maintains the fragile bond that is conducive to subsequent separation, as will be explained below. The stack 30 is illustrated in FIG. 1d.

Referring to FIG. 1e, the assembly composed of the stack 30, the useful layer 22 and the oxide layer 26 is detached or separated from the support 10 at the $SiC/SiO_2$ interface between the support 10 and the layer 26. As explained above, this interface involves limited bonding forces. Thus, detachment or separation may be accomplished by applying a mechanical tension and/or a shear stress and/or bending stresses, for example, by using a manual or automatically controlled blade. At the end of this process and after an appropriate surface treatment, the support 10 can be reused. The donor substrate 20 can also be reused and again subjected to the deposit of an $SiO_2$ layer and to implantation of gaseous species, as described above.

FIGS. 2a to 2e illustrate another process similar to that of FIGS. 1a to 1e, but that includes an oxide layer ($SiO_2$) 12 formed on the support 10 instead of on the source substrate 20. The oxide layer 12 participates in forming the separable interface. Thus, if the source substrate 20 is made of SiC, the molecular bonding properties between the oxide layer 12 and the source substrate 20 (FIG. 2b) would be similar to those between the oxide layer 26 and the support 10 of FIGS. 1a-1e. FIG. 2c illustrates the step of thinning or removing the source substrate 20, and FIG. 2d shows a stack 30 formed by epitaxially growing layers on the thin layer. FIGS. 2c and 2d are similar to FIGS. 1c and 1d. In this second embodiment, detachment or separation occurs between the oxide layer 12 and the useful layer 22, and the resulting assembly is illustrated in FIG. 2e.

Many variants may be made according to the invention. In particular, weakened molecular bonds can be formed at the separable bonding interface by making a bond between two layers of silicon nitride $Si_3N_1$ deposited on the support 10 and on the source substrate 20, respectively. In particular, such layers can be made using a deposition technique (unlike oxide layers that are frequently made by superficial thermal oxidation), and this type of deposit necessarily creates a specific intrinsic roughness on the final free surface. Furthermore, $Si_3N_4$ creeps at higher temperatures than $SiO_2$. Thus, in this case, a polishing treatment that could greatly reduce the roughness should not be conducted.

According to another variant, a bond can be formed between an $SiC_2$ layer deposited on the support 10 or the source substrate 20, and a layer of $Si_3N_4$ deposited on the other of the source substrate 20 or on the support substrate 10. Once again, few strong siloxane-type or other types of bonds are formed between these two layers, even at high temperatures, and the bond thus remains separable after such treatments.

According to yet another variant, a layer of $SiO_2$ will be provided on the support 10 or the source substrate 20. The other layer can be provided with a layer having an appropriate intrinsic roughness, such that bond forces between the $SiO_2$ layer and the rough layer will develop moderately at the required temperatures, without any particular roughness treatment, so that the bond remains separable. For example, an intrinsically rough layer can be made by depositing an amorphous or polycrystalline silicon. In this case, the materials used to form the bond need not be different from each other. For example, direct bonding of SiC on SiC could occur. This implementation would take advantage of the intrinsic roughness of the SiC on both sides of the bond, its low creep characteristics, and the minimal ability to react chemically with itself. A variant that could be used, if necessary, is to use an SiC layer deposited on the useful layer or the support layer to increase the intrinsic roughness.

According to another example, a direct Si on Si bond could be made with several possibilities. For example, a polycrystalline Si (particularly for the support) could be used to benefit from its intrinsic roughness related to the existence of grain boundaries. In addition, or as a variant, it would be possible to deposit an interface layer of Si either on the support layer or on the useful layer or on both, as described above, to generate an increased intrinsic roughness. According to yet another example, a useful layer of SiC could be deposited directly on a sapphire support. Those skilled in the art will be able to construct or imagine other examples based on the description given above.

This invention is applicable in the field of manufacturing a wide variety of semiconductor-based assemblies in addition to those mentioned above, particularly with regard to those that utilize gallium arsenide (GaAs).

What is claimed is:

1. A method for preparing a semiconductor assembly, which comprises:
   providing a support substrate having a surface thereon;
   providing a donor substrate having a weakened zone that defines a useful layer and having a surface on the useful layer;
   providing an interface layer of a predetermined material on the surface of either the support substrate or the useful layer to provide a bonding surface thereon;
   molecularly bonding the bonding surface of the interface layer to the surface of the support substrate or the surface of the useful layer to form a separable bonding interface therebetween, and to thus form the semiconductor assembly; and
   heat treating the semiconductor assembly to a temperature of at least 1000° C. to 1100° C. without substantially increasing molecular bonding between the bonding surface of the interface layer and the surface of the support substrate or the surface of the useful layer so that the separable bonding interface maintains a sufficiently weak bond that can later be overcome by applying stresses to detach the useful layer from the donor substrate.

2. The method of claim 1, which further comprises detaching the donor substrate from the useful layer along the weakened zone after the heat treating.

3. The method of claim 2, further comprising depositing a stack of materials on the useful layer after the detaching.

4. The method of claim 2, which further comprises detaching the useful layer by applying a mechanical stress to the semiconductor assembly.

5. The method of claim 1, wherein the support substrate is made of at least one of polycrystalline silicon carbide, monocrystalline silicon carbide, or sapphire.

6. The method of claim 5, wherein the interface layer is made of at least one of silicon oxide or silicon nitride.

7. The method of claim 1, wherein or the useful layer is a germination layer for epitaxially growing a substrate.

8. The method of claim 1, wherein the useful layer is made of monocrystalline silicon carbide.

9. The method of claim 8, which further comprises
   applying a stress to detach the useful layer of monocrystalline silicon carbide from the support substrate at the separable interface; and epitaxially growing at least one substrate layer on a surface of the useful layer.

10. The method of claim 9, wherein the epitaxially grown substrate layer is made of a metallic nitride.

11. The method of claim 1, wherein an interface layer is provided on both the surfaces of the support substrate and useful layer.

12. The method of claim 11, wherein the material of each interface layer has a sufficiently low potential for chemically reacting with the other interface layer such that heat treating the semiconductor assembly at the high temperature does not increase molecular bonding so that the support substrate and the useful layer can be subsequently separated at the separable bonding interface by applying stresses to the assembly.

13. The method of claim 12, wherein the low potential for a chemical reaction between the interface materials is a function of a weak intrinsic mutual chemical affinity of the interface materials.

14. The method of claim 12, wherein the low potential for a chemical reaction between the interface materials is a function of a low creep characteristic of at least one of the interface materials.

15. The method of claim 12, wherein the interface materials are different.

16. The method of claim 15, wherein the first interface material is at least one of an oxide or nitride, and the second interface material comprises a carbide.

17. The method of claim 16, wherein the nitride is monocrystalline.

18. The method of claim 16, wherein the oxide is silicon oxide.

19. The method of claim 12, wherein both interface materials are nitrides.

20. The method of claim 12, wherein one of the two interface materials is a nitride and the other is an oxide.

21. The method of claim 12, wherein at least one of the interface materials has an intrinsically rough surface.

22. The method of claim 21, which further comprises forming the intrinsically rough interface material by depositing an interface material on a less rough surface.

23. The method of claim 12, wherein the semiconductor assembly comprises a silicon carbide substrate, a useful layer made of silicon carbide, and an interface layer of silicon oxide or silicon nitride.

24. The method of claim 1, wherein at least one of the surfaces is a monocrystalline material having a main crystallographic plane that is positioned at an inclination relative to the plane of its surface, and with the inclination of the main crystallographic plane intrinsically forming a sufficiently weak bond to facilitate and allow the detaching of the useful layer.

25. The method of claim 24, wherein the inclination of the main crystallographic plane is between about 3° and about 8°.

* * * * *

UNITED STATES PATENT AND TRADEMARK OFFICE
CERTIFICATE OF CORRECTION

PATENT NO. : 7,256,101 B2 Page 1 of 1
APPLICATION NO. : 10/893596
DATED : August 14, 2007
INVENTOR(S) : Letertre et al.

It is certified that error appears in the above-identified patent and that said Letters Patent is hereby corrected as shown below:

Title Page:
Item (56), References Cited, OTHER PUBLICATIONS:
"Matsushita et al." reference, delete "Semiconductor Research Center, pp. 343-345" and insert -- Japanese Journal of Applied Physics, vol. 29, No. 2, pp. L343-345 (1990) --.
Wong et al. reference, delete "American Institute of Physics," and insert -- Applied Physics Letters (2002) --.
"O. Rayssac et al." reference, after "Devices", delete "PX01-03" and insert
-- X, PV01-03 --.

Column 8:
Line 3 (claim 7, line 1), after "wherein" delete "or".

Signed and Sealed this

Fourth Day of December, 2007

JON W. DUDAS
*Director of the United States Patent and Trademark Office*